United States Patent [19]

Upadhyayula

[11] 4,207,476
[45] Jun. 10, 1980

[54] EXCLUSIVE OR CIRCUIT

[75] Inventor: Lakshminarasimha C. Upadhyayula, East Windsor, N.J.

[73] Assignee: RCA Corporation, New York, N.Y.

[21] Appl. No.: 932,622

[22] Filed: Aug. 10, 1978

[51] Int. Cl.² ................. H03K 19/32; H03K 19/08
[52] U.S. Cl. .................................. 307/216; 307/205
[58] Field of Search .............................. 307/216, 205

[56] References Cited

U.S. PATENT DOCUMENTS

| | | | |
|---|---|---|---|
| 3,500,062 | 3/1970 | Annis | 307/216 |
| 3,604,944 | 9/1971 | Gundersen | 307/205 |
| 4,145,624 | 3/1979 | Upadhyayula | 307/205 X |
| 4,160,919 | 7/1979 | Curtice | 307/216 |

*Primary Examiner*—John S. Heyman

*Attorney, Agent, or Firm*—Samuel Cohen; Robert L. Troike; Raymond E. Smiley

[57] ABSTRACT

An exclusive-OR circuit includes a first pair of field effect transistors (FETs), series coupled to a transferred electron logic device (TELD) and a second pair of FETs, arranged as an inhibit circuit. The second pair of FETs is either coupled in series with the first pair of FETs and TELD or in a parallel-serial relationship therewith in accordance with different embodiments of the invention. When a signal of a given polarity and a signal indicative of that signal are applied respectively to only one gate of each pair of FETs, the TELD produces an output signal. When a signal of a given polarity and a signal indicative of that signal are applied respectively to both gates of each pair of FETs, the second pair of FETs inhibits the TELD from producing an output signal.

9 Claims, 4 Drawing Figures

EXCLUSIVE OR CIRCUIT

The Government has rights in this invention pursuant to Contract No. N00014-75-C-0100 awarded by the Department of the Navy.

CROSS REFERENCE TO RELATED PATENT APPLICATION

This application is related to the following copending application: U.S. Application, Ser. No. 816,692 filed July 18, 1977, now U.S. Pat. No. 4,145,624 entitled "FET-TELD Combination with Capacitively Coupled Output Electrode Means," by the instant inventor.

BACKGROUND OF THE INVENTION

1. Field of the Invention

This invention relates to a combination of field effect transistors (FETs) connected to a transferred electron logic device (TELD) to form an exclusive OR gate. The TELD includes an output electrode capacitively coupled thereto for transmission of an output of predetermined voltage and alternating polarity for use in directly interconnected cascaded high speed logic applications.

2. DESCRIPTION OF THE PRIOR ART

In signal and data processing applications at gigabit rates it is desirable to utilize devices which offer fast switching speeds, typically on the order of 20 to 50 pico-seconds and output signals of substantial gains while providing "fan-out." "Fan-out" as the term is commonly used on logic applications refers to the number of similar circuits or gates a device is capable of driving. In many applications, it is also desirable to cascade the devices to meet various circuit requirements. In the cascaded arrangement, the output of the first device must be capable of triggering the following device. If the output of a logic device is of the same polarity as the input of the device to which it is connected triggering can be effected without additional inverters after each stage facilitating small or medium scale integration.

Logic gates formed of gallium arsenide (GaAs) field effect transistors operating in the depletion mode or formed of GaAs TELDs can handle data rates that are substantially higher than the highest rates that appear possible with logic gates made from silicon. Transferred electron logic devices, also at times referred to as Gunn devices, have desirable threshold properties which are utilized to achieve pulse rise and delay times of less than 50 pico-seconds. TELD logic gates can also be directly interconnected without inverters or level shifters. However, the TELD logic gate not only has poor input sensitivity but is also technologically difficult to design for high stable gain. Input sensitivity of a TELD, as is known in this art, is the minimum voltage signal required to trigger the TELD into the threshold mode of operation causing the formation of domains in the device and dropping the current therethrough. In contrast with a TELD, a FET has good sensitivity and easily achievable high gain, but such devices cannot be directly interconnected because the required dc input and available dc output levels are different. Moreover, the minimum pulse width that can be processed through FET circuits is disadvantageously in the order of 400 pico-seconds as discussed in *Gunn Effect Logic Devices*, by Hans L. Hartnagel, published by American Elsevier, Co., Inc., N.Y., 1973 page 111.

A circuit containing a pair of FETs and a pair of TELDs arranged as an exclusive-OR is known. In the known exclusive-OR circuit the FETs are connected source to source. A load resistor in series with the sources is used to produce the output signal. Respective drains are connected to two separate TELDs. The respective gates are coupled to input terminals to receive signals, the exclusive-OR product of which is to be determined. The TELDs are normally biased below threshold. The circuit component values are selected such that if a signal is applied to only one FET, oscillation is initialed, but if signals are applied to both FETs, oscillation in the TELD is not initialed. In this circuit the change in output voltage is a function of the load resistor value and current therethrough. The value of the resistor must be kept low to allow high speed operation. Therefore, for a reasonable output voltage change, the current must be relatively high.

SUMMARY OF THE INVENTION

An exclusive-OR circuit comprises a pair of field effect transistors each having a drain electrode, a source electrode, and a gate electrode. The source electrodes are coupled together. The drain electrodes are coupled together. Each of the gate electrodes is coupled to a different input terminal, each input terminal being adapted to receive a logic signal of a first or second polarity. The FETs are characterized by an ohmic region of operation in which the drain current varies with voltage and a constant current region of operation in which the drain current is substantially constant with voltage.

A transferred electron type device is connected to the pair of FETs to pass series current therethrough and is responsive to current above a threshold level to form domains therein.

The pair of FETs are biased to operate in the constant current region such that the drain current is below the peak current and above the lower current of the TELD.

A means is provided for applying an input signal of a given polarity to the gate electrode of at least one of the pair of FETs to normally increase the drain current to the pair of FETs to a level equal to or greater than the threshold current of the TELD, normally causing thereby the formation of said domains in the TELD.

An inhibit circuit is arranged to pass series current with the pair of FETs and the TELD. The inhibit circuit has first and second input terminals adapted to receive, respectively, a signal indicative of the polarity of input signals being applied to the input terminals of the pair of FETs. The inhibit circuit is responsive to logic pulses of the given polarity for preventing threshold current through the TELD.

DETAILED DESCRIPTION OF THE PREFERRED EMBODIMENT

Figure 1:
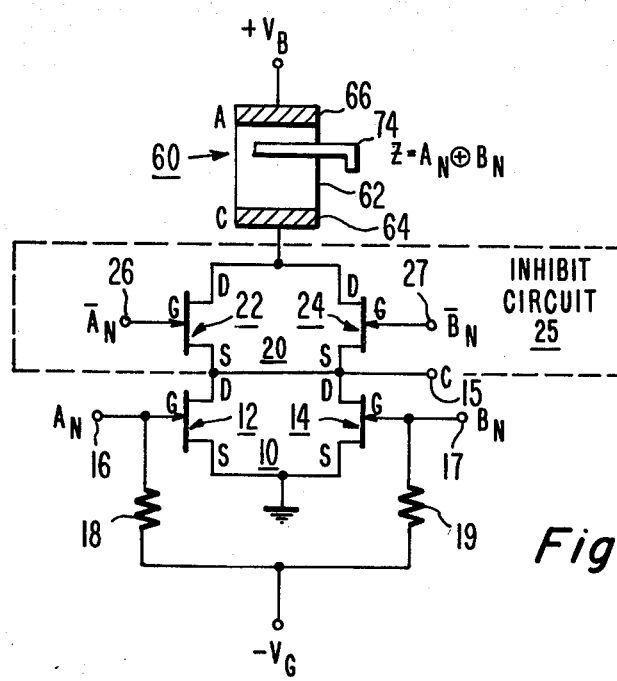
FIG. 1 is a schematic representation of an embodiment of an exclusive-OR circuit utilizing a TELD and a plurality of FETs in a serial arrangement.

Referring to FIG. 1, a first pair of 10 of field effect transistors 12 and 14 are connected drain (D)-to-drain and source (S)-to-source. The drains are connected to an output terminal 15 also designated (C) while the sources are connected to a source of reference potential such as ground. Gates (G) of FETs 12 and 14 are connected to respective input terminals 16 and 17, which are designated respectively $A_N$ and $B_N$. Input terminals 16 and 17 are connected respectively through bias resistors 18 and 19 to a source of reference potential $-V_G$. As will be explained more fully hereinafter the value of the bias resistors 18 and 19 and the value of source $-V_G$ are chosen so that FETs 12 and 14 are biased in saturation and pass a current which lies between the peak and valley currents for the TELD.

The drains of the pair 10 of FETs are coupled to the sources of a second pair 20 of FETs 22 and 24. FETs 22 and 24 comprise an inhibit circuit 25. FETs 22 and 24 have their sources connected together and their drains connected together. The gate of FET 22 is connected to an input terminal 26 also designated $\overline{A_N}$, while the gate of FET 24 is connected to an input terminal 27 also designated $\overline{B_N}$.

In the preferred embodiment of the invention all of FETs 12, 14, 22 and 24 are metal semi-conductor field effect transistors (MESFETs) although field effect transistors such as, for example, junction field effect transistors (JFETs) wherein the current is controlled by an electric field, may be used.

Field effect transistors may be operated in any of three modes: (1) depletion only, (2) enhancement only, and (3) a combination of enhancement and depletion. It is preferable, however, that the FETs be operated in the (1) depletion mode only. The depletion mode FET has considerable drain-source (hereinafter drain) current flow for zero gate-source (hereinafter gate) voltage. A gate voltage includes a voltage provided thereto from an external source and voltage provided by a bias supply, if any. As no forward gate voltage is utilized, maximum drain current flows when the gate voltage is zero. Drain current is reduced by applying a reverse voltage to a gate electrode. That is, drain current decreases as the gate voltage becomes more negative.

Figure 4:
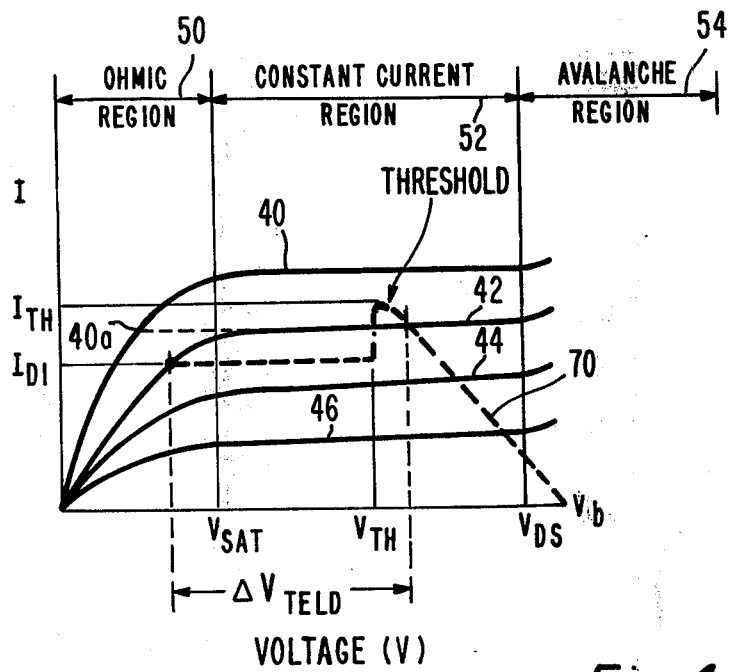
FIG. 4 is a graph of current-voltage characteristics of the exclusive-OR circuits of FIGS. 1 and 2.

In FIG. 4, the current-voltage characteristic of a typical depletion or a pair of depletion mode FETs connected in parallel, is shown by an exemplary family of solid curves 40, 42, 44, and 46. These curves illustrate drain current as a function of drain voltage at different gate voltages. Below a voltage known as saturation (knee), voltage $V_{SAT}$ a FET operates in a ohmic region 50. Above saturation or knee voltage $V_{SAT}$ up to the drain-source breakdown voltage $V_{DS}$, a FET operates in a constant-current region 52. A third region 54, above breakdown voltage is the avalanche region where a FET is not normally operated. In the ohmic region 50, the I-V curves have the characteristic of a resistor. The shape of the curves in ohmic region 50 is a function of drain voltage and a slope governed by gate voltage. In the constant-current region 52, the drain current is saturated, that is, the drain current is held at a constant level for a given fixed gate voltage. A change in gate voltage produces a change in drain current. Thus in the constant current region, a FET exhibits the transconductance characteristic that is essential to amplifier operation. The transconductance of the field effect transistor is defined as the a relationship between an input signal voltage and the output signal current with the drain voltage held constant.

Returning to FIG. 1, the drains of FETs 22 and 24 are connected to the cathode (C) terminal of a TELD 60 while the anode (A) terminal of the TELD is coupled to a source of bias potential $+V_B$. Thus first pair 10 of FETs, second pair 20 of FETs and TELD 60 are series coupled to allow series current to pass therethrough in an amount determined by the operation of the devices as will be described shortly.

TELD 60 is characterized by a non-linear resistance and is preferably of the planar type for integrated circuit purposes. TELD 60 comprises a body 62 of semiconductor material such as gallium arsenide (GaAs) and other group III-V compounds or mixtures of such compounds. Semiconductor body 62 exhibits a differential negative resistance through the "transferred electron effect," an effect well known and exhibited in Gunn devices and the like. For further details on the transferred electron effect see U.S. Pat. No. 3,991,328 issued Nov. 9, 1976, and U.S. Pat. No. 3,706,014 issued Dec. 12, 1972. A cathode terminal 64 and an anode terminal 66 are provided in a spaced relation on the semiconductor body 62 as shown in FIG. 1.

The current-voltage load line curve of TELD 60 is superimposed in FIG. 4 on the current-voltage of a typical FET and is indicated by a dashed curve 70. TELD 60 is a threshold device which is characterized by the formation of domains in the presence of a suitable biasing potential above threshold value. At the threshold voltage $V_{TH}$, the current $I_{TH}$ is at its peak. When TELD 60 is triggered by applying a voltage equal to or greater than $V_{TH}$, domains are formed and the device current drops to a lower level, or "valley current," $I_{D1}$. At anode-cathode voltages in excess of the threshold voltage, $I_{D1}$ is substantially constant with increasing voltage. In many TELD applications it is usual to bias the device slightly below threshold at a current and voltage which are typically about 0.90–0.95 times threshold. The slightly below threshold current is commonly referred to as the standoff or quiescent current level. When an input signal of sufficient magnitude is applied to the TELD to increase the value of the electric field above that of threshold, domains are formed and the device changes from a relatively high current state to a low current state. The threshold field of TELD 60 is the threshold voltage divided by the cathode electrode 64 to anode electrode 66 length.

In many logic applications devices within the circuit are cascaded as described in the prior art discussion above. In cascaded arrangements the output of a device must be capable of triggering the following circuit requiring the polarity of the output pulse to be the same as the polarity as the input trigger pulse of the following device. To provide for direct interconnection between the devices without the utilization of inverters and level shifters, an output electrode 74 (terminal Z) is capacitively coupled to TELD 60 in accordance with the present invention. When a domain is formed in TELD 60 as a result of a signal being applied to the cathode thereof, which causes the cathode-anode voltage to exceed $V_{TH}$ an output signal such as 80, FIG. 3, appears at electrode 74. The output is positive when the domain is traveling between the cathode terminal 64 and electrode 74 and negative when the domain is between electrode 74 and anode terminal 66. The output of the capacitively coupled electrode may be expressed as:

$$V_O = \alpha k V_{TH}$$

where $V_O$ is the output voltage in volts, $\alpha$ is the coupling constant and k is equal to $\Delta I/I_{TH}$, where $\Delta I$ is the change in TELD current and $I_{TH}$ is the threshold current of TELD 60 Because of the capacitive coupling of electrode 74 to TELD 60, there is no dc signal present in the output signal and the signal has pulses of alternating positive and negative polarity. Either of the two polarities may be utilized, as appropriate, allowing for direct cascading of logic devices.

Operation of the circuit of FIG. 1 will now be described with reference as necessary to the waveforms of FIG. 3, which are idealized voltage levels at various input and output terminals, and with reference to the waveforms of FIG. 4. In particular, as initial conditions it will be assumed that no signals are applied to terminals 16 and 17. Gate bias on FETs 12 and 14 and drain voltages are of such value that the FETs are capable of passing a constant current which is below $I_{TH}$ (FIG. 4), but above $I_{D1}$ (FIG. 4) such as for example, that illustrated by waveform 42 (FIG. 4). Terminals 26 and 27 are each coupled to a different signal which may be from terminal (C) of a pair of circuits similar to that of FIG. 1, which signals are normally at zero volts relative to the value at the source terminal (C) of the circuit of FIG. 1. FETs 22 and 24 are, therefore, gate biased such as to be capable of passing current in excess of $I_{TH}$ as that illustrated by waveform 40 (FIG. 4). However, considering the current limitations imposed by FETs 12 and 14, FETs 22 and 24 are operating out of saturation, such as at point 40a on waveform 40, FIG. 4.

The value of $V_B$ is chosen such that given the voltage at the cathode terminal of TELD 60 which occurs with current determined by the gate bias of FETs 12 and 14. The anode cathode voltage is less that $V_{TH}$ (that voltage which causes domain formation in the TELD).

Figure 3:
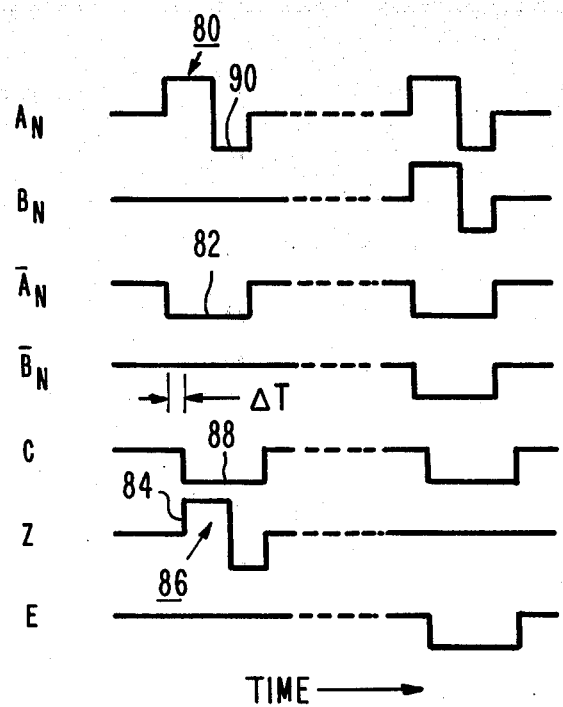
FIG. 3 is a set of logic waveforms useful in understanding the operation of the circuits of FIGS. 1 and 2.

With these initial conditions, it will be assumed that a pulse 80, FIG. 3, representing a logic 1 is applied to terminal 16, while a signal indicative thereof, such as a logic 0 negatively directed pulse 82 is simultaneously applied to terminal 26. Waveforms $A_N$ and $\overline{A_N}$, $B_N$ and $\overline{B_N}$, FIG. 3, typically are produced by other circuits similar to the circuit of FIG. 1. Therefore, waveform $A_N$ to $B_N$ may be produced at respective Z terminals of circuits similar to the circuit of FIG. 1 while waveforms $\overline{A_N}$ and $\overline{B_N}$ may come from respective C terminals of circuits similar to that of FIG. 1. It will be remembered that terminal Z is capacitively coupled to TELD 60 while terminal C is directly coupled to the drain of FETs 12 and 14. Therefore, the signal applied to terminals 16 and 17 are capacitively coupled thereto, while the signals applied to terminals 26 and 27 are directly coupled thereto. Thus, the gate signal applied to the gate of FET 12 is a combination of the voltage applied at terminal 16 and the bias provided by the combination of $-V_G$ and resistor 18. In like manner, a zero volt signal representing a logic 0 is capacitively applied to terminal $B_N$, while a logic 1 signal which is zero volts with respect to the potential at the source of FET 24 is applied to terminal $B_N$.

The various voltages operated on the various FETs as follows. The gate voltage of FET 12 becomes less negative, i.e., approaches zero, causing the drain current to increase to an amount at least equal to $I_{TH}$. The drain current of FET 14 is unchanged. The negatively directed signal applied to the gate of FET 22 causes it to go into saturation at a current which is much below $I_{TH}$ such as waveform 44, FIG. 4. The current passing capability of FET 24 is unchanged from the initial condition.

Therefore, current $I_{TH}$ is passed through FET 12, FET 24, and through TELD 60, which current causes a domain formation in TELD 60 and causes TELD 60 to pass lower current $I_{D1}$. The time delay $\Delta_T$ between the time of application of pulses 80 and 82 and the TELD 60 domain formation indicated by the leading positive edge 84 of output pulse 86 waveform Z (FIG. 4) is on the order of 40-50 pico-seconds and is due to the domain formation in the TELD, provided the external circuit RC-time constants are not limiting the operation.

As mentioned previously while a domain is traveling from the cathode electrode 64 to electrode 74 the output pulse will be positive. While the domain is traveling from electrode 74 to the anode electrode 66 the output pulse is negative.

When the domain is formed in TELD 60, the TELD voltage and current decreases causing current through pair 10 of FETs to decrease since the TELD is now limiting the current flow through the series path causing the voltage at terminal C to decrease and thereby producing output pulse 88 thereat (waveform C, FIG. 4). While the domain is traveling to the anode of TELD 60 the input signal at $A_N$ becomes negative. See pulse portion 90 waveform $A_N$ FIG. 3. This negative portion 90 of the input pulse has no effect on the activity within TELD 60. The negative pulse 90 will decrease drain current within FET 16, but still the current therethrough is limited by TELD 60 current.

If the positive and negative pulse at terminals $A_N$ and $\overline{A_N}$ respectively were to remain when the domain reached the anode of TELD 60 a new domain would form and the process above would repeat. However, the nature of the source of input pulses is such that they will return to the quiescent state before the domain reaches TELD 60 anode.

The process just described also applies to the situation in which logic 1 and logic 0 pulse are applied respectively to terminals 17 and 27 except that the high current path is then through FETs 14 and 22 rather than through 12 and 24 as previously described.

The situation will now be discussed in which logic 1 positively directed pulses are applied to the gates of both FETs 12 and 14 while negative going (logic 0) pulses are applied to the gates of FETs 22 and 24. In such a situation, no pulse is desired from TELD 60 since it will be understood that a pulse from TELD 60 is to occur only when one input pulse ($A_N$ or $B_N$) is present and no output pulse is to occur when zero or two input pulses are present. This situation is illustrated by the waveforms on the right half of FIG. 3.

Operation of the circuit of FIG. 1 with two input pulses is as follows. The increase potential at gate terminals 16 and 17 cause FETs 12 and 14 to be capable of passing more drain current. However, the decreased potential at gate terminals 26 and 27 make FETs 22 and 24 incapable of passing the increased current which FETs 12 and 14 could pass. That is, the second pair 20 of FETs acts as an inhibit current. Therefore, no increased current passes through TELD 60, in fact, less current passes therethrough than in the quiescent condition since the current is now limited by reduced current capability of pair 20 of FETs and TELD 60 produces no output pulse.

In summary, when one input signal is received, an output pulse is produced. When none or two input signals are received no output pulse is produced. This is an exclusive-OR function.

Figure 2:
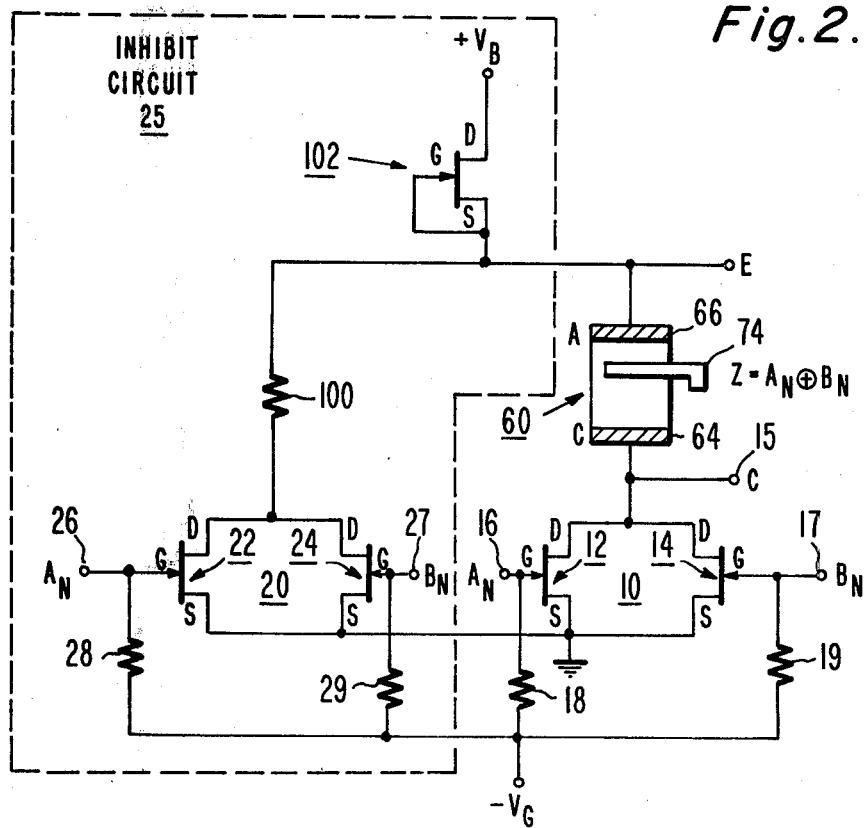
FIG. 2 is a schematic representation of a second embodiment of an exclusive-OR circuit utilizing a TELD and a plurality of FETs in a parallel serial combination.

Another embodiment of the exclusive-OR circuit in accordance with the present invention is illustrated in FIG. 2 to which attention is now directed. The circuit has the advantage over the circuit of FIG. 1 in that no inverted input signals are required. It does, however, require an additional non-linear load such as an additional FET in the inhibit circuit 25.

In particular, first pair 10 of FETs is coupled directly in series with TELD 60. The sources of the second pair 20 of FETs are coupled to the same source of reference potential as the sources of the first set. Additional bias resistors 28 and 29 are coupled to input terminals 26 and 27 and to $-V_G$ serve to bias FETs 22 and 24 in saturation. The drain of FETs 22 and 24 are coupled by a resistor 100 to the anode electrode 66 of TELD 60 such that a parallel circuit is obtained with TELD 60 and pair 10 of FETs.

Anode 66 is connected to a terminal E only for displaying the signal at that terminal, and to the source and gate of an additional serially connected FET 102, which acts as an non-linear load. The drain of FET 102 is coupled to bias source $+V_G$. In quiescent condition, FETs 12, 14, 22 and 24 are biased in saturation, while the value of components including resistor 100 are chosen such that 102 is biased in the ohmic region and the resulting anode to cathode voltage of TELD 60 is less than that required for domain formation.

Therefore, when a logic 1 pulse such as 80 (waveform $A_N$ FIG. 3) is applied to only a single FET of each pair 10 and 20 the resulting increase in current therethrough and resulting decrease voltage at the cathode 64 of TELD 60 relative to that of the anode 66 causes the TELD to form a domain as described in connection with the circuit of FIG. 1. Output pulses at terminals Z and C are the same as those of FIG. 1. When logic 1 input pulses are applied to both FETs of each pair 10 and 20 so much drain current flows through pair 20 of FETs and pair 10 of FETs that FET 102 is driven to saturation, causing a substantial voltage drop thereacross such that the voltage drop across TELD 60 is too low to cause domain formation. That is, the combination of FETs 26, 28 and 102 act as an inhibit to the formation of a domain in TELD 60 and resultant output pulse therefrom.

What is claimed is:

1. An exclusive OR circuit comprising in combination:
    a pair of field effect transistors (FETs) each having a drain electrode, a source electrode, and a gate electrode, said source electrodes being coupled together, said drain electrodes being coupled together, each of said gate electrodes being coupled to a different input terminal, each input terminal being adapted to receive a logic signal of a first or second polarity;
    a transferred electron type device (TELD) connected to said pair of FETs to pass series current therethrough, said TELD being characterized by the formation of a domain upon the application of an electric field above a threshold value, said device having a peak current at said threshold value and a lower current above said threshold value, said lower current being substantially constant with increasing voltage;
    said pair of FETs being biased to operate at a constant current region such that said drain current is below said peak current and above said lower current of said device;
    means for applying an input signal of a given polarity of said first and second polarities to the gate electrode of at least one of said pair of FETs to increase the drain current of said pair of FETs to a level equal to or greater than said peak current of said TELD causing thereby the formation of said domain in said TELD; and
    an inhibit circuit also arranged to pass series current with said pair of FETs and said TELD, said inhibit circuit having first and second input terminals adapted to receive, respectively, a signal indicative of the polarity of input signals being applied to said input terminals of said pair of FETs and responsive to both said logic pulses being of said given polarity for preventing said peak current through said TELD to thereby prevent domain formation therein.

2. The combination as set forth in claim 1 wherein said inhibit circuit comprises a second pair of FETs arranged as said first mentioned pair with the drains and sources thereof also arranged in said series current path, the gates thereof coupled respectively to said first and second input terminals of said inhibit circuit.

3. The combination as set forth in claim 1 wherein said inhibit circuit comprises a second pair of FETs with the sources connected together and with the drains connected together, the gates thereof being coupled to said first and second input terminals thereof being coupled to said first and second input terminals thereof respectively said drains and sources thereof being coupled in parallel with the series connection of said first mentioned pair of FETs and TELD said inhibit circuit further including a non-linear load series coupled with said parallel combination, said non-linear load responsive to the signal produced by the parallel combination when said given polarity signal is applied to the gates of said second pair of FETs for inhibiting said TELD for receiving said peak current.

4. The combination as set forth in claim 3 wherein said non-linear load is a FET having its gate electrode coupled to one of its source and drain electrodes, said source and drain electrodes thereof being in said series current path.

5. The combination according to claim 1, 2, 3, or 4, wherein said field effect transistors are gallium arsenide field effect transistors (GaAs FET).

6. The combination according to claim 1 wherein said field effect type transistors are biased to operate in the depletion mode.

7. The combination according to claim 1 wherein said transferred electron type device comprises a body of semiconductor material and spaced anode and cathode terminals connected to said body, and wherein said cathode terminal is connected to said drain electrode of said pair of FETs and said source electrodes of said pair of FETs is connected to a reference source of potential.

8. The combination as set forth in claim 7 wherein the semiconductor material of said body is gallium arsenide.

9. The combination as set forth in claim 1 wherein said device includes electrode means capacitively coupled to said device for transmission of said output pulsed signal, a capacitive coupling of said electrode means producing an alternating positive and negative polarity in said output pulsed signal.

* * * * *